United States Patent [19]

Yum

[11] 4,187,472
[45] Feb. 5, 1980

[54] AMPLIFIER EMPLOYING MATCHED TRANSISTORS TO PROVIDE LINEAR CURRENT FEEDBACK

[75] Inventor: Dooho Yum, Elk Grove Village, Ill.

[73] Assignee: Beltone Electronics Corporation, Chicago, Ill.

[21] Appl. No.: 873,217

[22] Filed: Jan. 30, 1978

[51] Int. Cl.² ............................................. H03F 1/34
[52] U.S. Cl. .................................. 330/260; 330/271; 330/293
[58] Field of Search ........................ 330/257, 260, 265

[56] References Cited
U.S. PATENT DOCUMENTS 3,921,091  11/1975  Van Kessel et al. ............ 330/260 X Primary Examiner—James B. Mullins
Attorney, Agent, or Firm—Allegretti, Newitt, Witcoff & McAndrews

[57] ABSTRACT

A feedback transistor, whose base and emitter are connected respectively to the base and emitter of a common emitter output transistor, conducts a collector current which is directly proportional to the output current. The collector current of the feedback transistor is fed back to the input of an amplifier which drives the output transistor. The resulting negative feedback controls overall gain, reduces distortion, and controls the quiescent current of the output transistor. Application of this linear current feedback technique to both class A and class B amplifiers is disclosed.

6 Claims, 2 Drawing Figures

AMPLIFIER EMPLOYING MATCHED TRANSISTORS TO PROVIDE LINEAR CURRENT FEEDBACK

SUMMARY OF THE INVENTION

This invention relates to electronic amplifiers and, more particularly, to an arrangement for achieving negative, linear, current feedback in a solid-state amplifier.

Negative feedback is often used to improve the performance of electronic amplifiers. The closed-loop gain of a negative feedback amplifier is given by the relation:

$$\frac{E_{OUT}}{E_{IN}} = \frac{A}{1 - AB}$$

where A is the forward gain of the amplifier with negative feedback removed, and B is the fraction of the output which is returned to the input (the feedback signal being inverted in phase with respect to the input signal). When the forward gain A becomes very large, the closed-loop gain is very nearly equal to 1/B; that is, the closed-loop gain becomes essentially independent of variations in A. Moreover, it can be shown that the effects of noise and distortion introduced by the amplifier are dramatically reduced by negative-feedback.

A low-distortion amplifier having accurately controlled gain can accordingly be achieved by the combination of an amplifier having high forward gain (A) and circuit means for returning an accurately determined fraction (B) of the output signal to the amplifier input.

According to a principal feature of the present invention, a feedback current, which is an accurately determined fraction of the output current, is supplied to the amplifier's input by a feedback transistor. The feedback transistor is interconnected with, and has characteristics which are matched to those of, the output transistor(s). The same signal voltage is applied across the base-emitter junctions of both the output transistor(s) and the feedback transistor, thus producing a collector current in the feedback transistor which is directly proportional to load current and which is fed back to the amplifier input.

According to a further feature of the invention, the quiescent current of the output transistor(s) is directly proportional to the quiescent current established for the feedback transistor, allowing the output circuit's quiescent operating point to be readily set by adjusting the feedback transistor's quiescent current.

The principles of the present invention can be applied to advantage in a class B "push-pull" amplifier by the use of a pair of feedback transistors, each of which has its emitter and base connected respectively to the emitter and base of one of the pair of output transistors. A current mirror circuit is employed in combination with the feedback transistors to develop a feedback current whose magnitude is directly proportional to the effective output current, which is the difference between the collector currents flowing through the two class B output transistors.

BRIEF DESCRIPTION OF THE DRAWINGS

These and other features and advantages of the present invention will become more apparent through a consideration of the following detailed description. In the course of this description, reference will frequently be made to the attached drawing in which.

DETAILED DESCRIPTION OF THE EMBODIMENT

Figure 1:
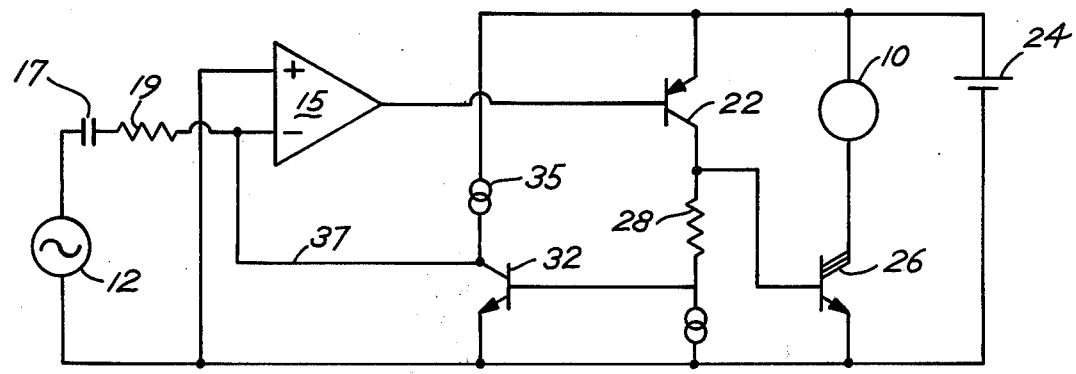
FIG. 1 is a schematic diagram of a class A linear amplifier which illustrates one application of the principles of the invention.

FIG. 1 shows a linear amplifier having a class A transistor output stage for delivering an amplified current waveform to a load 10 which is an accurate replica of the input signal voltage waveform produced by a source 12.

The signal from the source 12 is applied to the negative input terminal of a high-gain amplifier 15 through the series combination of a capacitor 17 and a source resistance 19. The positive input terminal of amplifier 15 is grounded. Positive-going signals from the source 12 applied to the negative terminal of amplifier 15 produce negative-going signals at the output of amplifier 15 which are applied to the base of a transistor 22, causing that transistor to become increasingly conductive. The emitter of transistor 22 is connected to the positive terminal of a supply voltage source 24 and its collector is connected to the base of an output transistor 26. The output transistor 26 may comprise a plurality of parallel bipolar devices whose collectors, bases and emitters are connected together, or may comprise a single device of enlarged geometry. A fixed resistor 28 is serially connected with a current source 30 is connected to the base of feedback transistor 32 whose emitter is grounded and whose collector is connected to the positive terminal of source 24 by a constant current device 35.

The feedback transistor 32 is supplied with a base-to-emitter voltage which differs from the base-to-emitter voltage applied to output transistor 26 by the voltage drop across resistor 28. The current supplied by the constant current device 30 is chosen to be large compared to the base current of transistor 32 so that the voltage drop across resistor 28 is essentially constant.

For the reasons to be discussed later in more detail, the collector current flowing in feedback transistor 32 is directly proportional to the collector current flowing in the output transistor 26. Thus, a positive-going voltage from source 12 applied to the negative (or "inverting") input of the amplifier 15 produces a negative-going signal at the amplifier's output, causing transistors 22, 26 and 32 to become increasingly conductive. The increased feedback current in conductor 37 accordingly represents negative feedback, decreasing the input signal level applied to amplifier 15. Amplifier 15 preferably takes the form of an operational amplifier constructed as a linear integrated circuit on the same chip with transistors 22, 26 and 32. Hence, all of the active devices in the circuit of FIG. 1 (as well as in FIG. 2 to be discussed) are preferably bipolar transistors constructed with the same monolithic integrated circuit fabrication technology.

Over a wide range of operating conditions, the emitter current $I_e$ flowing in such a bipolar transistor is given by the expression:

$$I_e = I_o [\exp(\frac{qV_b}{mkT}) - 1]$$

where $I_o$ and m are parameters of the transistor depending upon its geometry, composition and method of manufacture, $V_b$ is the base-to-emitter voltage, q is the electronic charge ($=1.6\times10^{-19}$ C), k is Boltzmann's constant ($=1.38\times10^{-23}$ joule/k), and T is absolute temperature in degrees Kelvin.

For high-beta transistors, the collector current is very nearly equal to the emitter current, $I_e$. If n matched transistors are connected in parallel (that is, all of their collectors are connected together, all of their bases are connected together, and all of their emitters are connected together), the collective collector current will be n times that flowing in a single transistor.

Thus, in the circuit of FIG. 1, if transistor 26 comprises n parallel connected transistors, and if feedback transistors 32 is matched to each of the transistor(s) 26, and further if resistor 28 is replaced with a short circuit so that the base of transistor(s) 26 is directly connected to the base of transistor 32, then the collector current flowing in the transistor 32 will be 1/n times that flowing in the load 10.

The same result (the development of a directly proportional feedback current) can also be achieved if the output transistor 26 is one or more transistors fabricated with larger geometry (larger junction areas) than the feedback transistor 32, but with the same composition and method of fabrication. In this case, only the transistor parameter $I_o$ differs between the output and feedback transistors, and the ratio of load current to feedback current is a constant determined by the relative geometries of the output and feedback transistors.

A further method of obtaining a fixed ratio of load to feedback currents is illustrated by the combination of constant current source 30 and resistor 28 in FIG. 1. The constant voltage drop across resistor 28 introduces a constant D.C. voltage difference $\Delta V$ between the base-to-emitter voltages applied to transistors 26 and 32.

For normal operating currents, the expression given earlier for the collector and emitter currents of a bipolar transistor can be simplified by the approximation:

$$I_{c1} \approx I_{e1} \approx I_o\left[\exp\frac{qV_b}{mkT}\right]$$

The collector current for the second transistor, $I_{c2}$, which has a base-to-emitter voltage of $V_b+\Delta V$, is then given by the approximation:

$$I_{c2} \approx I_{e2} \approx I_o\exp\left[\frac{q[V_b+\Delta V]}{mkT}\right]$$

$$= I_o\left[\exp\frac{qV_b}{mkT}\right]\left[\exp\frac{q\Delta V}{mkT}\right]$$

Thus, the ratio of the two currents $I_{c2}/I_{c1}$ is equal to $$\left[\exp\left(\frac{q\Delta V}{mkT}\right)\right],$$

a constant.

Figure 2:
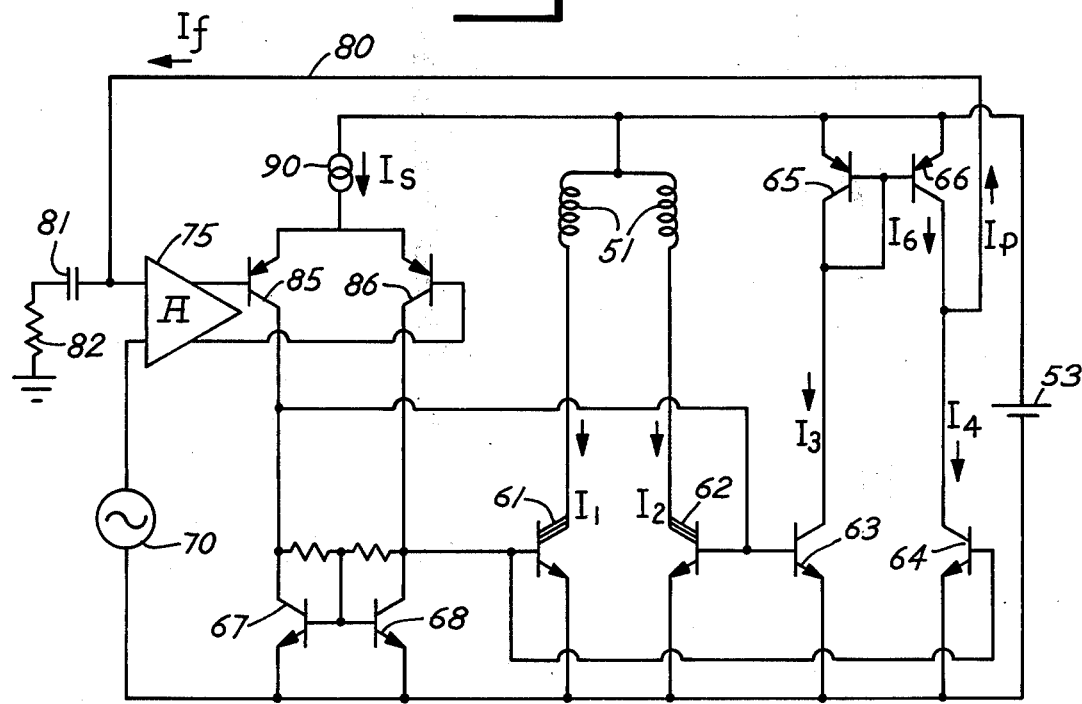
FIG. 2 is a schematic diagram of a class B linear amplifier which embodies the invention.

The principles of the present invention can be applied to advantage to improve the performance of class B solid-state amplifiers. Class B amplifiers provide high output-current capability without high quiescent power dissipation, features which are particularly desirable in certain applications, notably in hearing-aid amplifiers which must possess high-level output signal capability with low supply battery quiescent current drain. FIG. 2 shows an amplifier circuit of the type suitable for driving a center-tapped, mutually coupled hearing-aid output transducer (called a "receiver") shown at 51 in FIG. 2.

The center-tap of receiver 51 is connected to the positive terminal of battery 53, and each of its two windings are connected serially with one of two output transistors 61 and 62 to the battery's negative terminal. The emitters of transistors 63 and 64 are grounded and their collectors are respectively connected to the collectors of complementary PNP transistors 65 and 66 whose emitters are connected to the positive terminal of battery 53.

The emitters of transistors 67 and 68 are grounded. The collector of transistor 67 is directly connected to the bases of transistors 62 and 63 while the collector of transistor 68 is connected to the bases of transistors 61 and 64.

Input signals are supplied by source 70 which is connected between one input terminal of operational amplifier 75 and ground. The other input terminal of amplifier 75 is connected via feedback conductor 80 to the collectors of transistors 66 and 64. A load resistance 82 for the current feedback stage and a blocking capacitor 81 are serially connected between the feedback conductor 80 and ground. The differential output of amplifier 75 drives a pair of PNP transistors 85 and 86 whose collectors are connected to the collectors of transistors 67 and 68 respectively.

The emitters of transistors 85 and 86 are connected together and receive a constant $I_s$ from the constant current source 90 which, as will be seen, also serves to establish the quiescent operating current in the output transistors 61 and 62. The feedback current in conductor 80 is given by the quantity $I_f$ and the collector currents flowing in transistors 61 through 68 will hereinafter be expressed as the quantities $I_1$ through $I_8$ respectively.

Transistors 63 and 64 are feedback transistors whose base-to-emitter junctions are connected in parallel with the base-to-emitter junctions of output transistors 62 and 61 respectively. The collector currents $I_3$ and $I_4$ of the feedback transistors 63 and 64 are directly proportional to the collector currents $I_2$ and $I_1$ of the output transistors 62 and 61. The ratio M of $I_2/I_3$ and $I_1/I_4$ is determined by the relative number and geometry of these transistors.

The load represented by the receiver 51 is driven in push-pull fashion by the class B output transistors 61 and 62. It is required that $I_2$ minus $I_1$ be an undistorted replica of the input voltage delivered by the signal source 70, and that the quiescent current $I_{1q}$ and $I_{2q}$ be set to an appropriate value for class B operation.

The collector current $I_3$ of feedback transistor 63 drives a current mirror stage comprising transistors 65 and 66, which provides an output current $I_6$ which ideally equals its input current $I_3$. The output of the current mirror is connected to the collector of feedback transistor 64 so that the net feedback current $I_f$ equals $I_3$ minus $I_4$. Since $I_2=MI_3$ and $I_1=MI_4$ (where "M" is a constant), the feedback current $I_f=(I_2-I_1)/M$. The feedback current $I_f$ is thus an undistorted replica of the net output current.

Under quiescent conditions, assuming that the DC current required by the input of amplifier 75 is negligible compared to the currents $I_3$ and $I_4$, the feedback current $I_f$ will be essentially zero and as a result $I_{1q} - I_{2q}$ will be essentially zero. That is, the output quiescent currents will be equal.

Under quiescent conditions, assuming negligible base currents into transistors 61, 62, 63, 64, 67 and 68 compared to the current $I_s$, and assuming the characteristics of transistors 67 and 68 are matched to 63 and 64, the sum of quiescent currents $I_{3q}$ and $I_{4q}$ will be approximately equal to the current $I_s$. With $(I_{3q}+I_{4q})=I_s$ and since negative feedback of $I_f$ insures that $(I_{3q}-I_{4q})=0$, the result is that $I_{3q}=I_{4q}=\frac{1}{2} I_s$. The quiescent output currents $I_{1q}$ and $I_{2q}$ is therefore equal to $\frac{1}{2}$ $MI_s$. The quiescent output currents may thus be set by adjusting the current $I_s$.

Although the principles of the present invention may be applied to improve the performance of amplifiers constructed of discrete components, so long as the operating characteristics of the output and feedback transistors are effectively matched, the invention is particularly useful in the construction of integrated circuit amplifiers. The amplifying transistors as well as the feedback and output transistors may be formed in a monolithic body of semi-conductor material such that the feedback and output transistors possess inherently matched compositions but substantially different effective junction areas because of the enlarged geometry (or plurality) of the output transistor(s).

It is to be understood that the numerous modifications may be made to the specific circuits which have been described without departing from the true spirit and scope of the invention.

What is claimed is:

1. A solid-state linear amplifier comprising, in combination,
   a high-gain amplifier having an input and an output,
   a source of signals connected to supply an input signal current to the input of said amplifier,
   a load circuit,
   at least one bipolar junction output transistor having its collector connected to said load circuit,
   a bipolar junction feedback transistor, said feedback and said output transistors having substantially identical compositions and substantially different effective junction areas,
   means for connecting the output of said amplifier across the base-emitter junction of both said output transistor and said feedback transistor,
   and means for connecting the collector of said feedback transistor to the input of said amplifier.

2. An amplifier as set forth in claim 1 wherein said feedback transistor and said output transistor are both formed in the same monolithic body of semi-conductor material.

3. The linear amplifier set forth in claim 1 including means for applying a quiescent operating current having a predetermined magnitude to the collector of said feedback transistor to establish the magnitude of quiescent collector current flow in said output transistor.

4. A negative-feedback linear amplifier comprising, in combination,
   an operational amplifier having an input and an output,
   at least one output transistor having its collector-emitter path connected in series with a load circuit across an electrical power source,
   a feedback transistor having its base and emitter respectively connected to the base and emitter of said output transistor,
   said output transistor and said feedback transistor being matched bipolar transistors having substantially identical compositions but differing effective junction areas,
   means connecting the output of said operational amplifier to the base of said output transistor, and
   means connecting the collector of said feedback transistor to the input of said operational amplifier.

5. The linear amplifier set forth in claim 4 including means for applying a predetermined quiescent operating current to the collector of said feedback transistor to establish a corresponding quiescent collector current in said output transistor.

6. A negative-feedback class B linear amplifier comprising, in combination,
   a pair of output transistors connected in push-pull relation to a load,
   a pair of feedback transistors each having its base and emitter connected respectively to the base and emitter of one of said output transistors, said feedback transistors and said output transistors having like compositions and substantially different effective junction areas,
   circuit means for producing a feedback signal having a magnitude related to the difference between the magnitudes of collector current flowing in said pair of feedback transistors,
   a high-gain amplifier having an input and a differential output, said differential output being connected to drive said pair of output transistors, and
   circuit means for applying said feedback signal and an input signal to the input of said high-gain amplifier.

* * * * *